United States Patent
Donzier et al.

(10) Patent No.: US 8,931,347 B2
(45) Date of Patent: Jan. 13, 2015

(54) FLUID PRESSURE SENSOR AND MEASUREMENT PROBE

(71) Applicant: OPENFIELD, Versailles (FR)

(72) Inventors: Eric Donzier, Bercheres sur Vesgre (FR); Emmanuel Tavernier, Paris (FR)

(73) Assignee: Openfield SAS, Versailles (FR)

( * ) Notice: Subject to any disclaimer, the term of this patent is extended or adjusted under 35 U.S.C. 154(b) by 222 days.

(21) Appl. No.: 13/707,802

(22) Filed: Dec. 7, 2012

(65) Prior Publication Data

US 2013/0145853 A1 Jun. 13, 2013

(30) Foreign Application Priority Data

Dec. 9, 2011 (FR) ...................... 11 61376

(51) Int. Cl.
*G01L 9/00* (2006.01)
*B81C 1/00* (2006.01)

(52) U.S. Cl.
CPC ........... *G01L 9/0041* (2013.01); *B81C 1/00134* (2013.01); *G01L 9/0042* (2013.01); *G01L 9/0054* (2013.01)
USPC ............................... 73/706; 438/51; 257/415

(58) Field of Classification Search
None
See application file for complete search history.

(56) References Cited

U.S. PATENT DOCUMENTS

| 6,601,452 B2 | 8/2003 | Murata et al. |
| 6,928,879 B2 | 8/2005 | Partridge et al. |
| 6,988,412 B1 | 1/2006 | Wilner |
| 7,629,657 B2 | 12/2009 | Partridge et al. |
| 2001/0001550 A1 | 5/2001 | Bryzek et al. |
| 2013/0086989 A1* | 4/2013 | Hum et al. ...................... 73/708 |
| 2014/0216175 A1* | 8/2014 | Schricker et al. ........ 73/862.629 |

FOREIGN PATENT DOCUMENTS

| EP | 1452844 A1 | 9/2004 |
| WO | WO0029824 A1 | 5/2000 |

OTHER PUBLICATIONS

FR1161376 French Search Report, Jul. 27, 2012, France.
FR1161376 Written Opinion of the French Search Report, Jul. 27, 2012, France.

* cited by examiner

*Primary Examiner* — Andre Allen
(74) *Attorney, Agent, or Firm* — The Jansson Firm; Pehr B. Jansson

(57) ABSTRACT

A fluid pressure measurement sensor (11) comprises a microelectromechanical system (MEMS) chip (23). The MEMS chip (23) comprises two lateral walls (56), a sensitive membrane (49) connected to said lateral walls (56) and sealed cavity (9). The exterior surfaces of the lateral walls (56) and the sensitive membrane (49) are exposed to the fluid pressure. The lateral walls (56) are designed to subject the sensitive membrane (49) to a compression stress transmitted by the opposite lateral walls (56) where said lateral walls (56) are connected to the sensitive membrane (49) such that the sensitive membrane (49) works in compression only. The MEMS chip (23) also comprises a stress detection circuit (31) to measure the compression state of the sensitive membrane (49) which is proportional to the fluid pressure.

34 Claims, 12 Drawing Sheets

FLUID PRESSURE SENSOR AND MEASUREMENT PROBE

TECHNICAL FIELD

This invention relates to a fluid pressure sensor.

More precisely, the pressure sensor according to the invention is intended for use under extreme pressure conditions such as those encountered in wells, for example, during oil and gas exploration, production and transport. Typically, for these applications the pressure may extend from a few hundred bars to more than 2000 bars.

TECHNICAL BACKGROUND

For operating conditions as extreme as these, the technologies currently used for pressure measurement are very limited and are based on the use of macroscopic mechanical parts made from high-strength steel alloys such as inconel or quartz and are associated with complex manufacturing techniques. Consequently, the high-pressure probes available on the market are large (typically several tens of centimeters long), expensive and offer only limited features.

An important characteristic of downhole instrumentation requirements is due to the fact that most phenomena to be assessed during the drilling, production or stimulation operations may be related to small variations around the nominal pressure value which, as described previously, is very high.

Recent breakthroughs in the silicon and microelectronics industry have led to the development of miniaturised pressure sensors. The main advantage of this technology is that the sensitive elements are manufactured in batches from silicon wafers, in order to produce a large number of "chips" at low cost.

However, the performance and reliability of sensors using sensitive elements of this type are limited, especially under the above-mentioned extreme pressure conditions.

Silicon is in fact a very brittle material when it is subjected to elongation/strain forces. A relative elongation/strain of about 1% breaks the crystal and therefore destroys the sensor. Even for tension stress levels less than this limiting value, the dislocations present in the crystal shift, resulting in fatigue problems and damage to the sensitive element.

The situation is different when the silicon is subjected to compression forces where, in this case, the material can withstand very high stresses without fatigue problems. In practice, contractions of up to about 5% can be accepted without risk of breakage.

When developing a sensor, it is therefore critical to optimise the distribution of stresses in the structures. This distribution will define the sensor's metrological performance, sensitivity, stability and robustness.

The sensitive element of a silicon pressure sensor according to the state of the art is shown on FIGS. 1A and 1B and comprises a rigid frame 1 with at its centre an area of reduced thickness created by micromachining the silicon in order to create a sensitive membrane 2 comprising an upper wall 3 and a lower wall 4.

Stress-sensitive resistors 5, including two resistors 5a positioned longitudinally and two resistors 5b positioned transversally, also called piezoresistors or gauges, are located on the membrane 2 and connected together by connection means 6 in order to form a Wheatstone bridge measurement circuit.

We refer to FIG. 2, illustrating the sensitive element of the sensor which has a plate 8 attached under its lower side, thereby forming a cavity 9 under vacuum and creating an absolute pressure sensor.

The sensitive element, known in the prior art, operates as follows: the effect of the pressure applied on the upper wall 3 of the membrane 2 creates a force which induces a deflection in said membrane and the appearance of mechanical stresses in the plane of the membrane, which are measured by the piezoresistors.

FIG. 3 illustrates the shape taken by the stress CT along axis AM of the membrane for a given pressure.

The areas of maximum stress appear at the junction areas (in tension MT on the upper wall of the membrane and in compression MC on its lower wall) and at the centre of the membrane (in compression MC on the upper wall and in tension MT on the lower wall).

FIG. 4 is a diagrammatic representation of the stress detection circuit according to the prior art.

The resistors are supplied with voltage and current from the exterior via electrical contacts 7a and 7b.

The output of the sensitive element is defined by the voltage difference Vs between contacts 7c and 7d which is expressed by the following relations obtained in reference to FIG. 5:

$$V_s = \frac{1}{2} \cdot V \cdot (\Delta Rl/Rl - \Delta Rt/Rt),$$

$$\Delta Rl/Rl = Gl \times \Delta l/l,$$

$$\Delta Rt/Rt = Gt \times \Delta l/l, \text{ in which:}$$

V is the bridge power supply voltage,

Rl is the value of a longitudinal piezoresistor 5a (the two longitudinal gauges are assumed to be identical), which is subjected to an elongation $\Delta l/l$ due to the effect of pressure on the membrane which is directed along the current flow axis in the resistor, and $\Delta Rl$ the variation in the value of this resistor under the effect of this stress with respect to the membrane position at rest, i.e. without pressure.

Rt is the value of a transverse piezoresistor 5b (the two transverse gauges are assumed to be identical), which is subjected to an elongation $\Delta l/l$ due to the effect of pressure on the membrane which is directed perpendicular to the current flow axis in the resistor, and $\Delta Rt$ the variation in the value of this resistor under the effect of this stress with respect to the membrane position at rest (without pressure).

Gl and Gt are the longitudinal and transverse gauge factors of the piezoresistors. For monocrystalline silicon, these factors depend on the orientation, type and doping concentration (e.g. the boron doping concentration CB in atoms per cm3) and the temperature T (in degrees Celsius), as illustrated on FIGS. 6 and 7.

The arrow labelled i represents the current direction.

This type of sensitive element exhibits the following disadvantages, which downgrade the sensor performance:

the area of maximum stress is concentrated on a small area and must be perfectly aligned with respect to the positions of the junction areas of the membrane, making it difficult to position the piezoresistors and resulting in a loss of signal;

the maximum allowable pressure of the sensor is limited by the fact that silicon is subjected to a high level of tension stress at the junction areas. Consequently, the sensitivity must be limited to remain below the breakage and stability stress levels.

DISCLOSURE OF THE INVENTION

One objective of this invention is to overcome the disadvantages of the prior art, by designing a complete measurement system which is more suited to monitoring well production and maintenance operations, inexpensive to manufacture and optimised to take a highly accurate measurement under extreme pressure conditions.

One aspect of the invention therefore concerns a fluid pressure measurement sensor comprising a microelectromechanical system (MEMS) chip. The MEMS chip comprises two lateral walls, a sensitive membrane connected to said lateral walls and sealed cavity. The exterior surfaces of the lateral walls and the sensitive membrane are exposed to the fluid pressure. The lateral walls are designed to subject the sensitive membrane to a compression stress transmitted by the opposite lateral walls where said lateral walls are connected to the sensitive membrane such that the sensitive membrane works in compression only. The MEMS chip also comprises a stress detection circuit to measure the compression state of the sensitive membrane which is proportional to the fluid pressure.

The sensitive membrane may take a rectangular shape comprising two long sides, wherein the two opposite lateral walls connected to the sensitive membrane by its two long sides are designed to subject the sensitive membrane to a compression stress in a direction perpendicular to the long sides. A height of the lateral walls may be at least five times greater than a thickness of the sensitive membrane, for example ten times. The cavity may be filled with a gas whose reference pressure is less than the fluid pressure to be measured.

Another aspect of the invention concerns a probe comprising this type of fluid pressure measurement sensor comprising a microelectromechanical system (MEMS) chip.

DESCRIPTION OF THE DRAWINGS

Other features, purposes and advantages of this invention will appear on reading the detailed description which follows, according to the embodiments given as non-limiting examples and referring to the attached drawings in which.

DETAILED DESCRIPTION OF THE INVENTION

In all the FIGS., identical or similar references refer to identical or similar components or sets of components. The proportions of the various elements shown on the drawings are realistic and conform with the manufacturing processes used, especially the MEMS chip manufacturing process as illustrated on FIG. 21.

Figure 8:
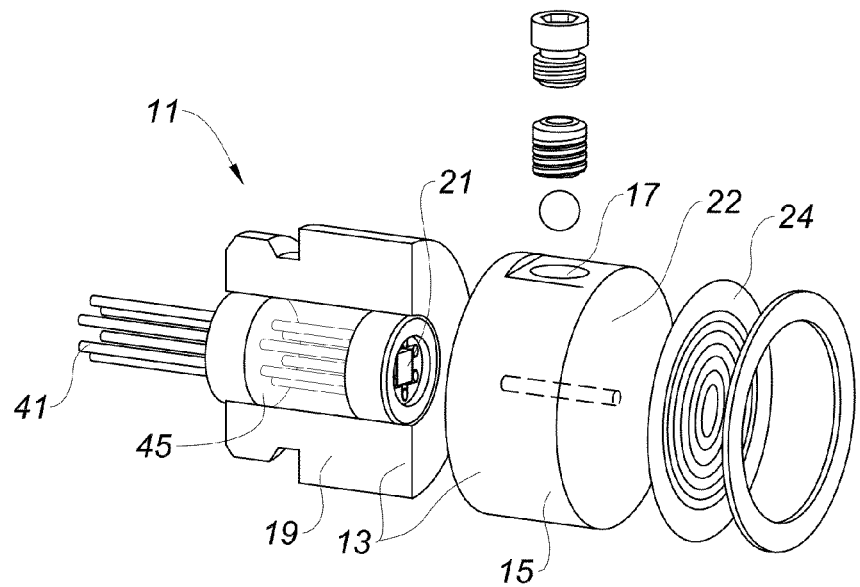
FIG. 8 is an exploded view of the pressure sensor according to a first embodiment of the invention.

In addition, this description uses words such as "upper" and "lower", in reference to the position of the sensor when it is in vertical position, as shown on FIG. 8.

We refer to FIG. 8, illustrating an exploded view of the sensor 11 according to an embodiment of the invention, suitable for use in wells.

Sensor 11 comprises an outer envelope 13, containing an inert fluid 17 in its upper part 15 and a sensitive element 21 in its lower part 19.

The upper part 22 of the outer envelope 13 is protected from the fluid whose pressure is to be measured, which may be corrosive, by a diaphragm 24, typically consisting of a stainless disc separating said fluid from the inert fluid 17 contained in the upper part 15 of said envelope 13.

The sensitive element 21 of the sensor 11 consists of a microelectromechanical system chip 23 (referred to as "MEMS chip", for MicroElectroMechanical System, or silicon sensor, in the remainder of the description).

Figure 9:
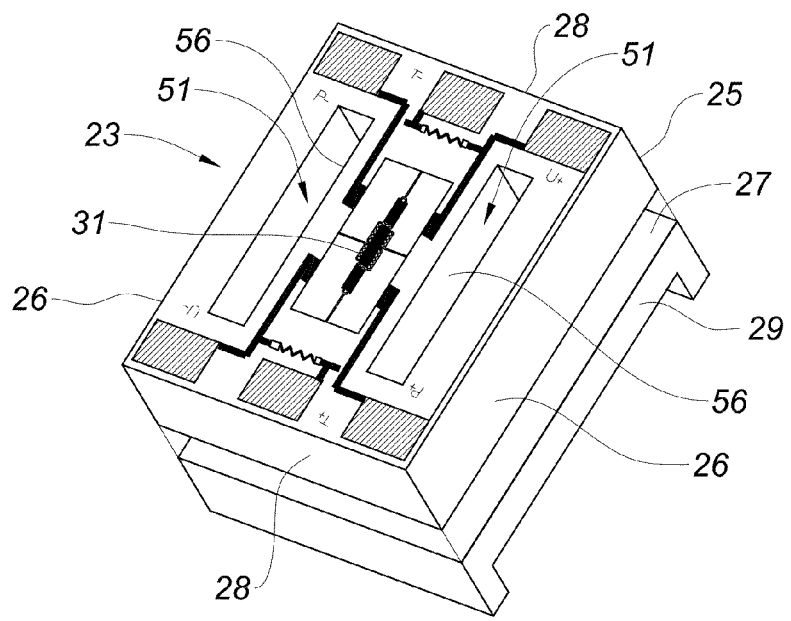
FIG. 9 illustrates the composition of the MEMS chip of the sensor shown on FIG. 8.

Referring to FIG. 9, the MEMS chip 23 comprises a stack consisting of a first silicon substrate 25, a support substrate 27 and a second silicon substrate 29. The support substrate 27 can be an insulating substrate such as glass or Pyrex, or a semiconducting substrate such as silicon. Use of silicon to manufacture one or more elements of the MEMS chip is a non-limiting example since other materials can be used to produce these elements.

The first silicon substrate 25 comprises a monocrystalline silicon sensitive membrane which can be stressed mechanically under the effect of the inert fluid pressure, and a stress detection circuit 31 comprising electrical resistors. The silicon substrate 25 takes the shape of a rectangular parallelepiped comprising substantially flat outer lateral walls 26, 28. Obviously, the silicon substrate may take a different parallelepipedic shape, such as a cube for example.

The second silicon substrate 29 connects the MEMS chip 23 and a support element 33 (shown on FIG. 11) of the sensitive element, belonging to a sensor body. This connection is typically produced by bonding.

Figure 10:
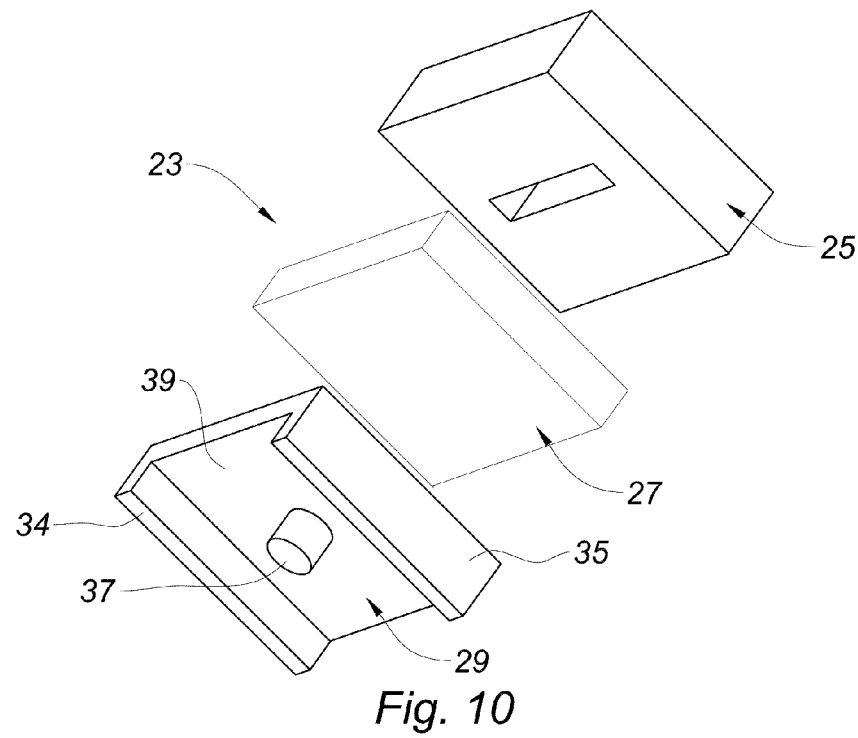
FIG. 10 is a view similar to FIG. 9, the MEMS chip being shown upside down.

FIG. 10 is an exploded view of the MEMS chip 23 turned upside down compared with its representation on FIG. 9.

The contact surface 34 between the silicon substrate 29 and the support element of the sensor body is formed by the peripheral edge 35 of the substrate 29 and via a connection pin 37 forming a stud, substantially formed in the centre of said substrate, and extending perpendicular to the lower wall 39 of the silicon substrate 29.

The connection pin 37 can be used to assemble the chip 23 in its support element by a virtually point bond, so that the MEMS chip 23 is not affected by the stresses from the mechanical support, which could come for example from the sensor box under the effect of temperature or pressure changes or impacts during the operations.

The connecting pin 37 forms an uncoupling element providing excellent measurement stability. This is an improvement over the state of the art chips which have an unstructured tacking surface, which is difficult to bond and which may impair the sensor metrology by generating problems of hysteresis and shift.

According to another embodiment not shown, the contact surface between the second silicon substrate and the sensor body consists of a plurality of studs distributed for example substantially on the periphery of said substrate. For example, the contact surface may include a central stud and four studs located at the vertices of the lower wall of the substrate.

Preferably however, the area of the contact surface between said substrate and the sensor body does not exceed 50% of the area of said silicon substrate of the MEMS chip 23.

Figure 11:
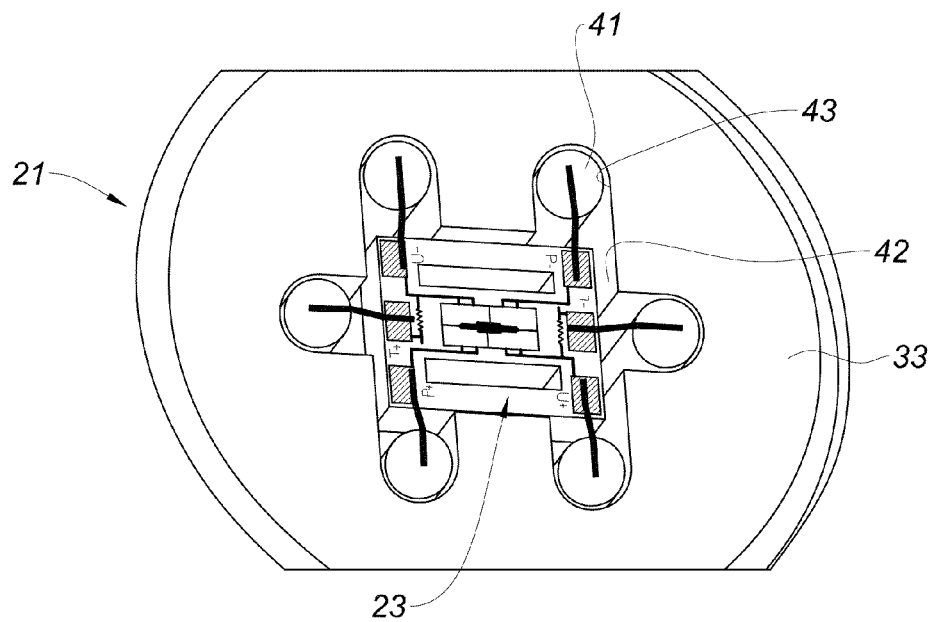
FIG. 11 shows the sensitive element of the sensor positioned in the housing socket of the support element.

We now refer to FIG. 11, illustrating the MEMS chip 23 assembled in its support element 33.

The MEMS chip 23 is designed to be connected to a data processing device (70 shown on FIG. 12) via electrical connection means 41.

The support element 33 of the MEMS chip 23 is made from a material such as ceramic. Said support element comprises a housing socket 42 to receive the MEMS chip 23 and housings 43 to receive the electrical connection means 41 connecting the MEMS chip 23 and the data processing device.

These housings 43 typically consist of drillings substantially perpendicular to the housing socket 42 of the MEMS chip 23.

FIG. 8 shows that the pressure sensor also comprises a pressure feedthrough 45 (i.e. a through-hole for electrical conductors sealed with respect to the fluid pressure) forming a pressure barrier between the MEMS chip 23 and the data processing device.

The pressure feedthrough is housed between the support element 33 of the MEMS chip 23 and a housing of the sensor body, preventing the transmission of pressure to the data processing device. This pressure feedthrough comprises a glass or ceramic cylinder and is equipped with a plurality of conducting elements 41 to make the electrical connection between the MEMS chip 23 and the data processing device.

Furthermore, the data processing device can communicate with a data acquisition device located preferably on the surface, via telemetry communication means, possibly including sound or electromagnetic type wave transmission means, for example, and an electrical cable installed in the well and connecting these transmission means to the surface device.

Figure 12:
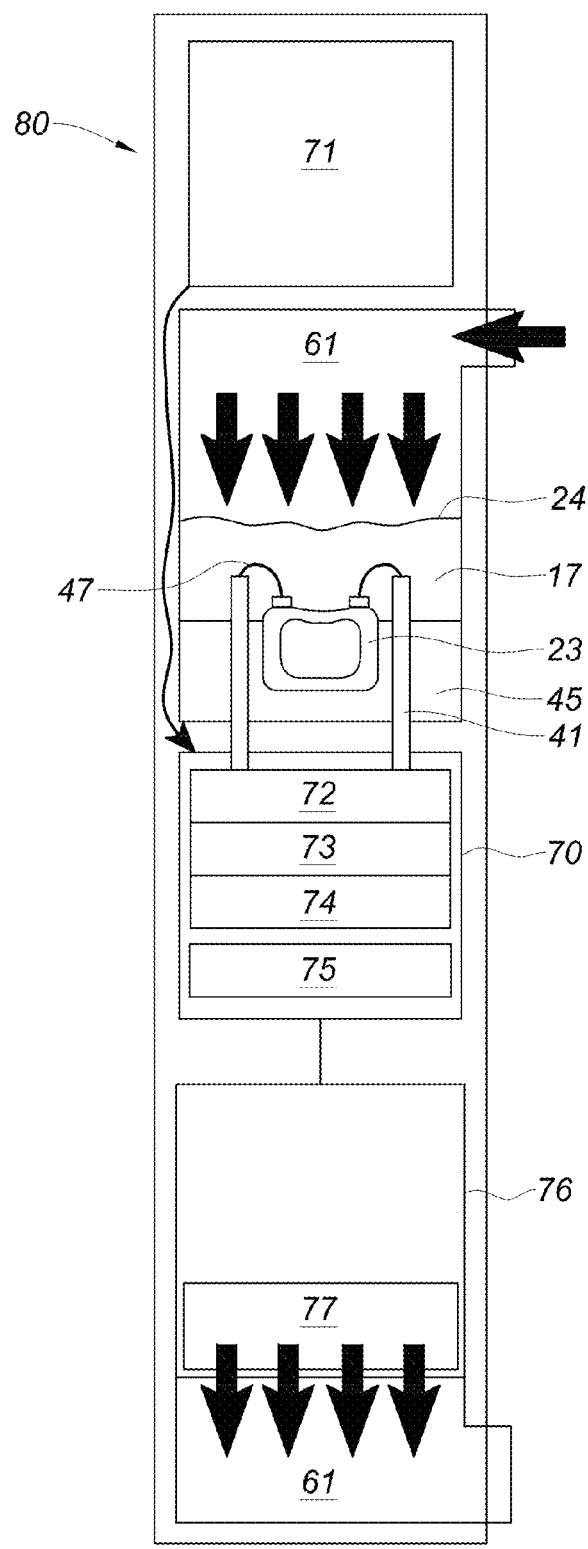
FIG. 12 is a diagrammatic representation of the pressure sensor according to the embodiment example shown on FIGS. 8 to 11 when said sensor is integrated in a probe.

Operation of the sensor described above in reference to FIGS. 8 to 11 will be easier to understand by referring to FIG. 12, which provides a diagrammatic illustration of its operation for an application in a probe 80. This probe 80 can for example be deployed in a well directed towards a hydrocarbon reservoir.

The fluid 61 (for example fluid from the hydrocarbon reservoir may include oil, gas, water, acid compounds, etc.) whose pressure is to be measured exerts a force on the sensor according to the invention, on the protection diaphragm 24.

The inert fluid 17, for example silicone oil, in contact with the MEMS chip 23, transmits the pressure exerted on the diaphragm 24 to the sensitive membrane 49 of the MEMS chip 23.

As previously described, the fluid in the well may be highly corrosive. This may be the case when the fluid contains hydrogen sulphide and/or fracturing acids. The inert fluid 17 is used to transfer the pressure of said fluid to the sensitive membrane of the chip 23 and prevent direct contact between said chip and the fluid, which would seriously damage the chip membrane if the fluid was corrosive.

The membrane deforms under the effect of the pressure exerted by the inert fluid 17, this mechanical stress is then converted by the stress detection circuit into a variation in electrical resistances and in bridge unbalance voltage.

This voltage is then transferred to the data processing device via the electrical connection means 41 crossing the pressure barrier 45. Typically, the electrical connection means 41 comprise a plurality of conducting elements composed of plugs connected at one end to the sensitive elements of the MEMS chip forming electrical contacts, via electrical cables 47 exhibiting good electrical conductivity properties, such as gold or aluminum wires, and at the other end to the data processing device 70.

The pressure sensor is housed inside the probe 80 which also receives the above-mentioned data processing device, thereby optimising the performance of the pressure sensor and making it highly flexible to use in the field. The data processing device 70 may, as required, comprise the following main modules: a power supply 71 (for example a battery coupled to a voltage regulator or a current generator to power the gauge bridge and the resistance temperature detectors, one or more differential amplifiers 72 whose inputs are connected to the output of the gauge bridge and to the resistance temperature detector (RTD), an analogue-digital converter 73, a microcontroller converting data into calibrated pressure and temperature values 74, a memory 75 to store the data recorded and a communication module 76 to communicate with the exterior.

According to one configuration, the communication module 76 uses electromagnetic coupling to listen and transmit data on a cable connecting the surface to the well bottom, or to a partial section of the well.

The probe 80 has a transformer coupled to the cable, in order to detect signals present on the cable but also to transmit signals on this cable. Each probe uses a set of specific frequencies allocated to transmit its data. One simple encoding system is to transmit a train of sine waves at a frequency F1 to transmit a logical "0" and a train of sine waves at a frequency F2 to transmit a logical "1". A time window allocation algorithm is executed for each probe so that the probes do not all communicate at the same time.

The surface acquisition system operates similarly, with a cable interface transformer and a set of communication frequencies.

An additional frequency, with large amplitude signals, can be used to transmit electrical energy to the well bottom, for example to power the probes if batteries cannot be used, as in the permanent systems.

One advantage of this approach compared with the state of the art, where several probes must be electrically connected to the cable, which involves cutting the cable and making a solder joint or splice under difficult field conditions, is that it is easier to install and more reliable.

According to another configuration, the communication module 76 of the probe 80 uses sound transmission. A sound wave is emitted by a transducer 77 in contact with the fluid which is propagated in the well and detected remotely by the communication module of other probes or the surface module, or a downhole communication module connected to a surface module by a cable.

The calibrated data are then sent to the data acquisition device (not shown) located on the surface, by communication set up by sound or electromagnetic type wave transmission, allowing real-time data processing.

Figure 13:
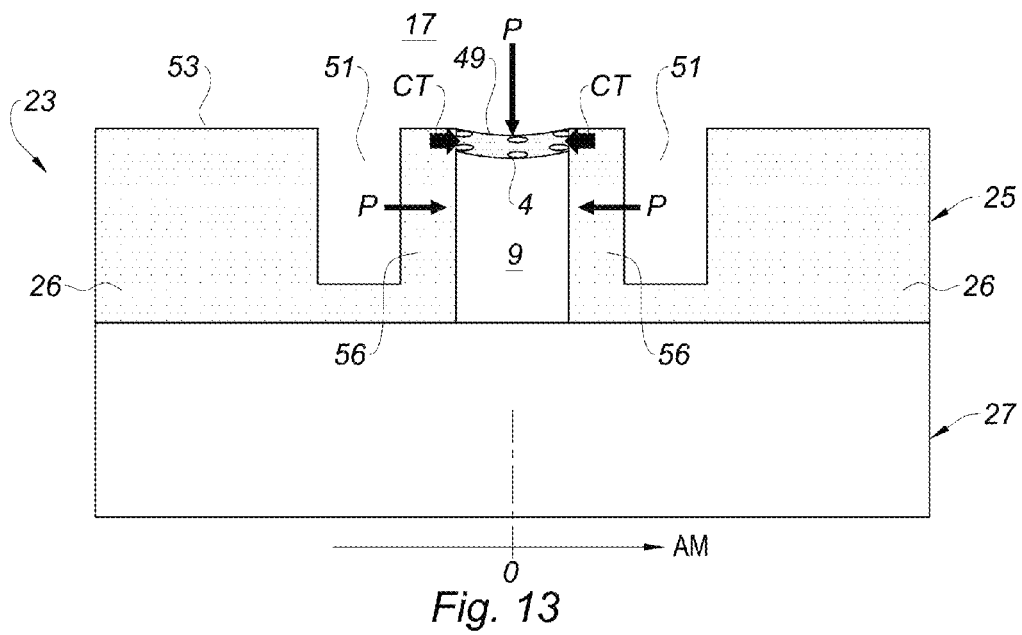
FIG. 13 shows the MEMS chip substrate used to make the membrane.

We now refer to FIG. 13, illustrating the first substrate 25 of the MEMS chip 23 shown on FIG. 9, said substrate being attached to the glass or Pyrex type support substrate 27, for example by electrostatic bonding. The attachment of the support substrate 27 to the lower part of the first substrate 25 defines a cavity 9 under vacuum, in order to create an absolute pressure sensor. The second silicon substrate 29 (shown on FIGS. 9 and 10) has been omitted.

The sensitive membrane 49 of the MEMS chip is made in the substrate 25 of said chip and deformed under the effect of the pressure P exerted by the inert fluid 17.

The effect of the pressure P applied on the upper side of the membrane 49 creates a force which induces a deflection in said membrane and the appearance of mechanical stresses in the plane of the membrane, which are measured by the piezoresistors.

According to the first embodiment of the invention, the first substrate 25 of the chip comprises at least two grooves 51 cut perpendicular to the upper wall 53 of the substrate of said chip and located each side of the membrane 49.

Preferably, the grooves 51 take a substantially rectangular shape and are produced near the junction area of the membrane 49, said junction area of the membrane being made substantially in the centre of the upper wall 53 of the substrate 25, but shifted if required to another part of the upper wall of the substrate, for example to its periphery.

These grooves 51 define inner lateral walls 56 whose upper parts form the junction areas of the membrane 49. The lateral walls 56 are designed so as to transmit the pressure P exerted by the fluid on the sides of the membrane 49, thereby generating a compression stress CT added to the stresses due to the pressure acting on the surface of the membrane 49.

Figures 14A, 14B:
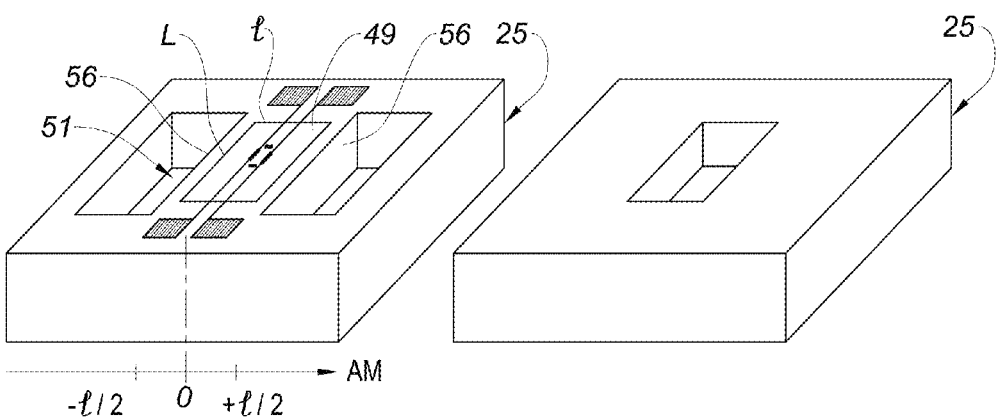
FIGS. 14A and 14B illustrate respectively the upper and lower sides of the silicon substrate 25.

FIGS. 14A and 14B illustrate respectively the upper and lower sides of the silicon substrate 25 comprising the membrane 49 according to the above-mentioned example of embodiment.

The membrane 49 takes a substantially rectangular shape, of length L and width I, to ensure it is subject to compression along a preferential axis useful for the stress detection circuit, and to optimize transfer of the compression force of the inner walls 56 on the membrane 49. For example, the length L is about 1mm and the width 1 about 0.2 mm.

Appropriately, the length of the membrane 49 is at least twice its width.

In addition, appropriately, the grooves 51 are arranged so that the inner walls 56 are substantially parallel to the long sides (of length L) of the membrane.

One advantage with this type of geometry is that the stress at the centre of the membrane 49 is mostly along the axis of its width (therefore parallel to its short sides), thereby optimising the positioning and sensitivity of the piezoresistors.

This configuration of the sensitive element increases the sensitivity and the stability and offers better resistance to excess pressure compared with the state of the art solutions.

Embodiments have in fact demonstrated that an output signal greater than 0.5 volt for 1 volt of bridge supply can be reached without breakage or fatigue of the membrane. This result is much greater than the prior art of silicon sensors, for which a maximum output signal of just 0.1 volt for 1 volt of bridge supply can be reached without risk of breakage or fatigue of the membrane.

Figure 15:
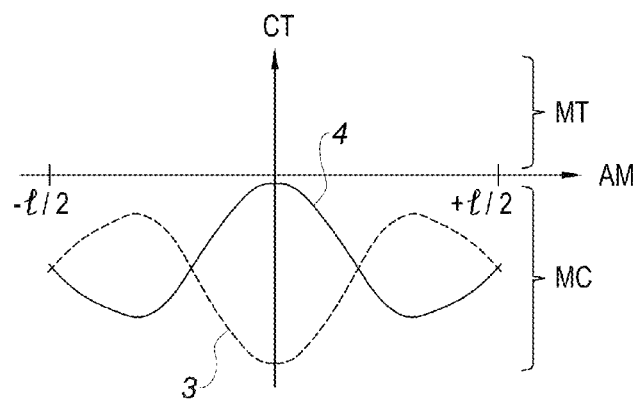
FIG. 15 illustrates the shape taken by the stress along the membrane axis for a given pressure.

We now refer to FIG. 15, illustrating how the stress CT exerted on the membrane varies along an axis AM (horizontal on FIG. 15) directed along its width I, parallel to the direction of the stress CT, from one edge located at a position −I/2 (on the left on FIG. 15) to the other edge located at a position +I/2, for a given pressure. The membrane 49 works only in compression MC (i.e. the membrane does not work in tension MT), which means that stress levels much greater than those obtained by the prior art sensors can be obtained in the elastic region of silicon.

Figure 16:
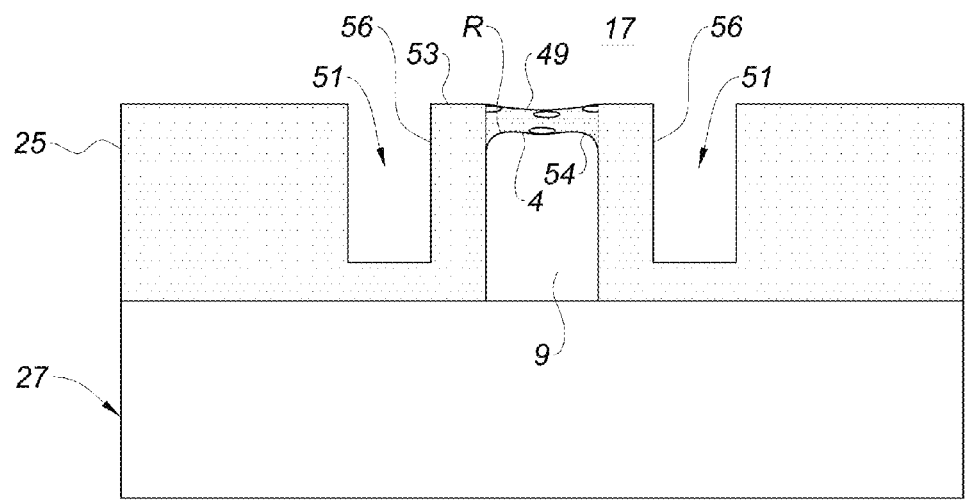
FIG. 16 illustrates the arches connecting the membrane to the chip.

FIG. 16 shows an alternative embodiment of the sensor according to the invention in which the sensitive membrane 49 is connected to the lateral wall 56 of the first substrate 25 of the chip via arches 54 formed in the cavity 9. These arches form reinforcements allowing the membrane 49 to increase its resistance to the mechanical stresses it undergoes.

These arches 54 connect the inner walls of the cavity 9 to the lower wall 4 of the membrane 49, and are profiled in a direction substantially parallel to the length L of the membrane.

The radius of curvature R of the arches 54 can be equal to about 50 micrometers.

Figure 17:
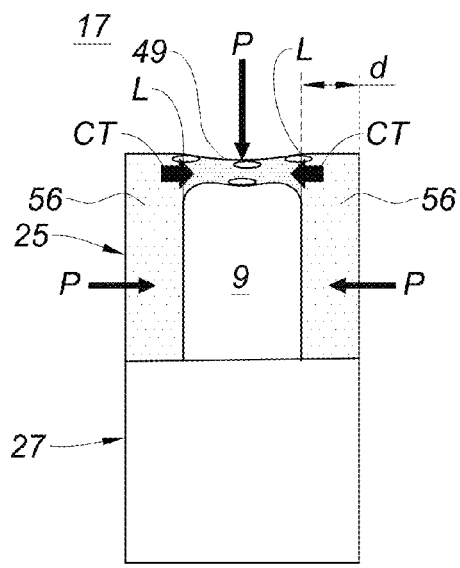
FIG. 17 shows another embodiment of the chip.

According to another embodiment, shown on FIG. 17, the distance d between firstly each long side L of the membrane 49 and secondly the outer lateral side 26 of the wall of the silicon substrate 25 to which it is connected is relatively small. The distance d is for example between about 100 micrometers and 1 millimeter, and less than three times the cavity height. In this configuration, the chip has no grooves. The arrangement is such that the pressure P is transmitted to the membrane by the outer lateral sides 26 forming the long sides of the chip. In this other embodiment, the outer lateral sides 26 of the MEMS chip connected to the long sides of the sensitive membrane 49 act as lateral walls 56 (the lateral walls are no longer created by the grooves 51) and transmit a compression force to the membrane under the effect of the outer pressure.

In this example of embodiment, grooves in the chip are avoided while benefiting from a membrane which works only in compression. This effect is controlled by adjusting the ratio between the height of the lateral walls 56 and the height of the cavity 9 (or the thickness of the membrane).

Figure 18:
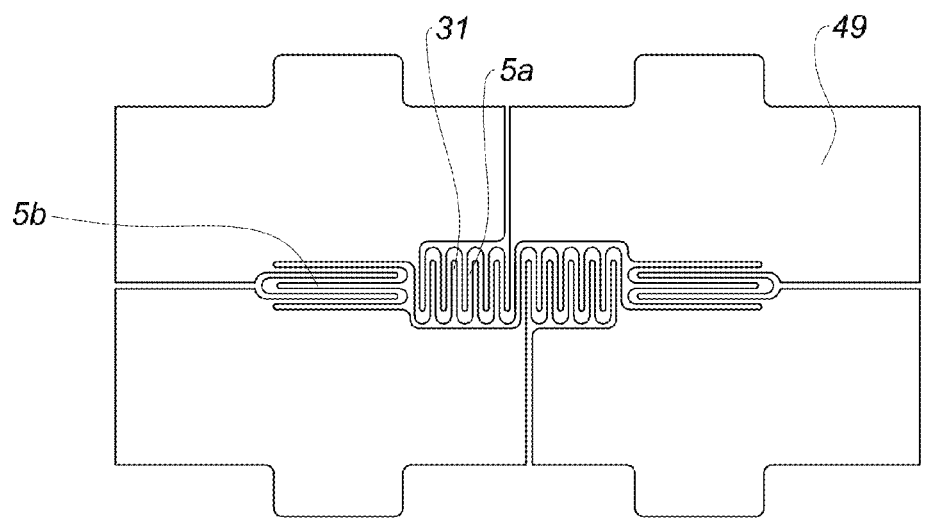
FIG. 18 illustrates the geometry of the piezoresistive gauges.

FIG. 18 shows the stress detection circuit 31 in the membrane 49. Said circuit comprises a Wheatstone bridge arrangement, comprising piezoresistive components $5a$, $5b$, also called piezoresistors or stress gauges whose resistivities vary when they are subjected to mechanical stresses.

According to the invention, the stress gauges $5a$, $5b$ are positioned in the centre of the membrane, area of maximum stress, in order to obtain a strong output signal from the bridge.

Figure 7:
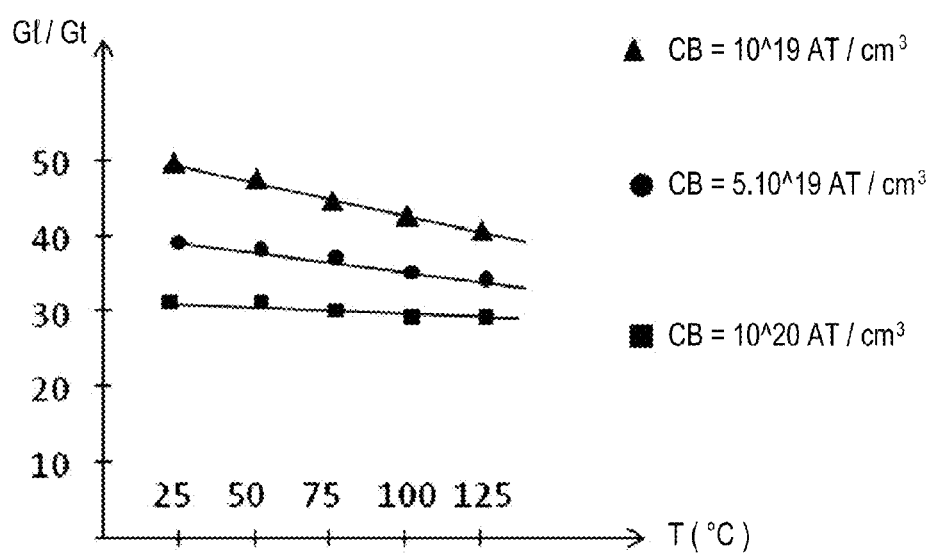
FIG. 7 illustrates the gauge factor variation as a function of the temperature, according to three boron doping concentrations considered.

As shown previously on FIG. 7, we observe that the silicon gauge factor depends on the temperature, which leads, for a bridge powered by a fixed voltage, to a bridge output voltage not only dependent on the pressure but also on the temperature, an effect known as thermal drift of the sensor sensitivity.

The piezoresistors can be highly doped in order to limit this disturbing effect.

However, this doping reduces the sensitivity to pressure of the sensitive elements, the absolute transverse and longitudinal value of the gauge factor being less at high doping concentrations.

Another approach consists in powering the bridge with current. The loss in sensitivity of the gauge bridge related to the temperature increase can in fact be compensated by increasing the bridge supply voltage.

A doping concentration is therefore chosen such that the thermal sensitivity of the doped silicon resistivity compensates as closely as possible for the thermal sensitivity of its gauge factor.

Figure 19:
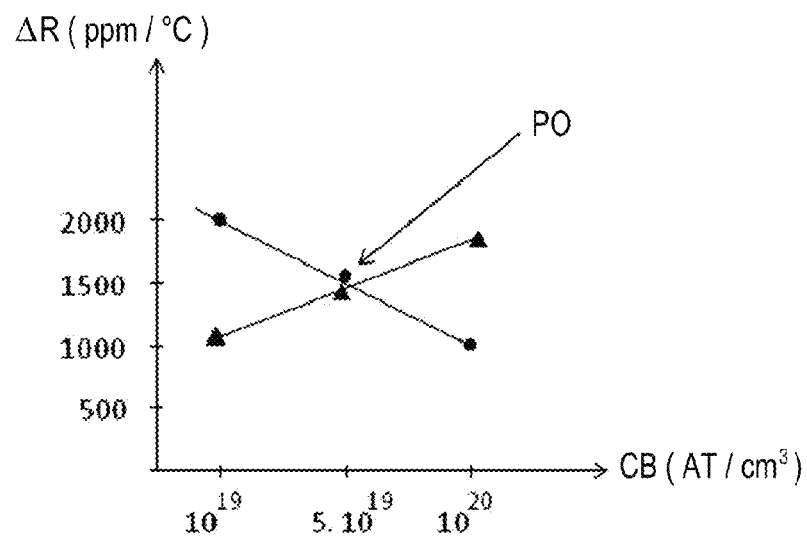
FIG. 19 shows the thermal sensitivity values for the resistivity and the gauge factor measured experimentally for three different boron doping levels.

FIG. 19 gives thermal sensitivity values of the resistivity and the piezoresistive effect ΔR (in ppm/° C.) recorded experimentally, showing that for a doping concentration CB of about $5.10^{19}$ boron atoms per $cm^3$, the effects compensate for each other (optimum compensation point PO). Despite these improvements, however, the sensitive element retains a residual thermal sensitivity of about 1%, which must be compensated in order to reach the very high levels of metrological performance expected (accuracy of about 0.01%).

The method proposed is to place one or more resistance temperature detectors (RTDs) 55a, 55b produced with the same silicon wafer as the piezoresistors 5a, 5b, on the same chip and near the gauge bridge.

This solution integrates easily in the chip manufacturing process, without increasing the cost since no steps are added.

A known solution to reduce the residual thermal sensitivity of the sensitive element consists in placing a resistance temperature detector on the rigid frame of the MEMS chip, away from the membrane stresses.

This approach is satisfactory for sensors of low pressure range but exhibits problems at high pressure. For pressures of several hundred bars, in fact, the stress on the frame can no longer be neglected and the effects of the piezoresistors appear on the resistance temperature detectors.

According to the invention, the resistance temperature detectors (RTD) 55a, 55b are positioned along a crystalline axis whose gauge factor is zero. In this case, the detectors 55a, 55b are positioned longitudinally to the crystalline axis <100>.

Figure 20:
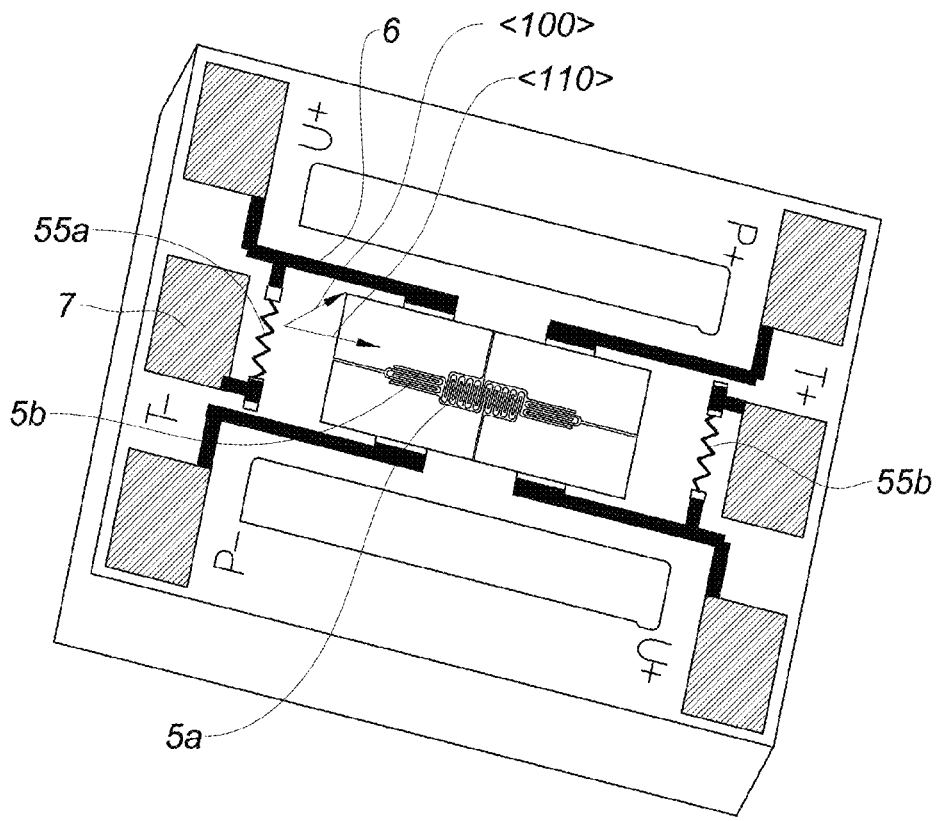
FIG. 20 illustrates the geometry and orientation of the sensitive chip resistors, including the resistors for the temperature measurement.

In addition, according to the invention, and referring to FIG. 20, the resistance temperature detectors (RTD) 55a, 55b take a special geometry, in the shape of a plurality of chevrons connected together at their lateral ends.

Figures 1A, 1B:
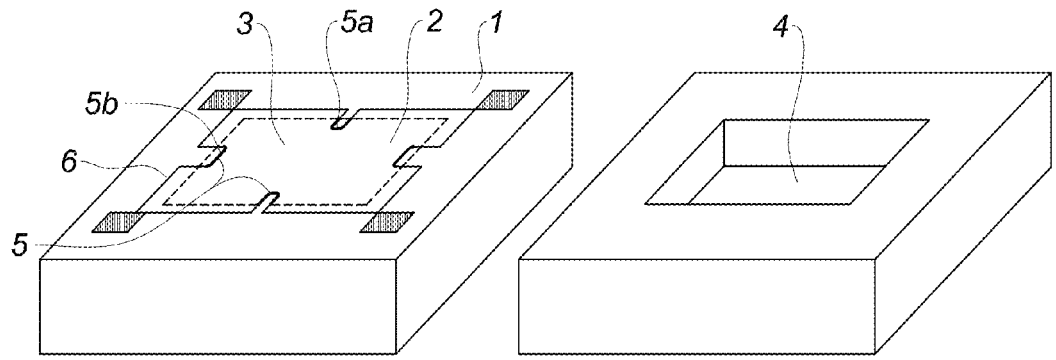
FIGS. 1A and 1B illustrate the sensitive element of a silicon pressure sensor according to the state of the art.
Figure 2:
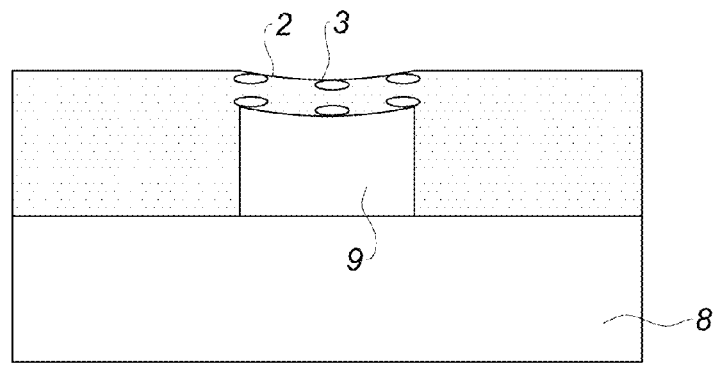
FIG. 2 is a cross-sectional view of the sensitive element of the sensor according to FIG. 1.
Figure 3:
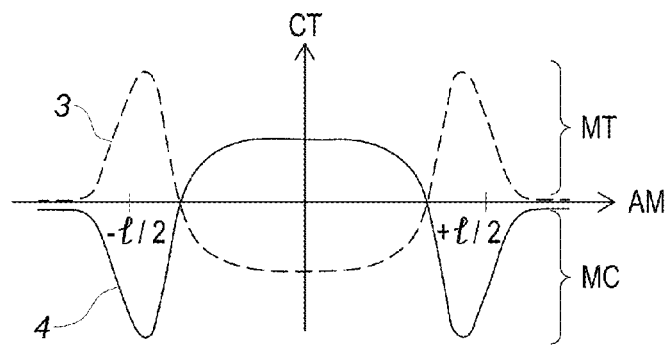
FIG. 3 illustrates the shape taken by the stress along the membrane axis for a given pressure, for a sensor such as that represented on FIGS. 1 and 2.
Figure 4:
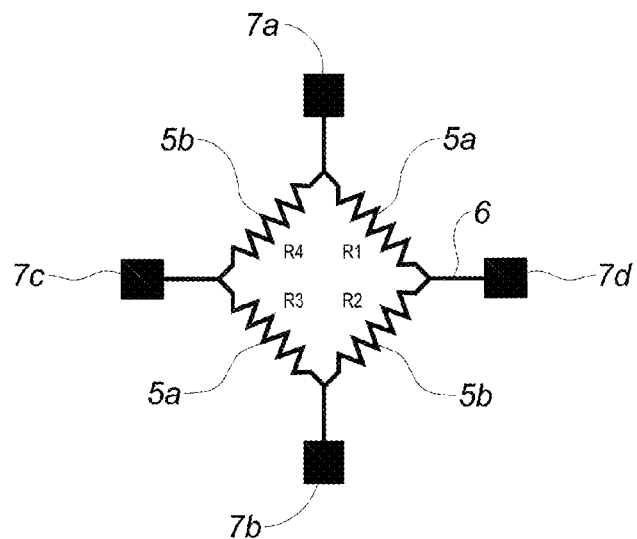
FIG. 4 is a diagrammatic representation of the stress detection circuit according to the state of the art.
Figure 5:
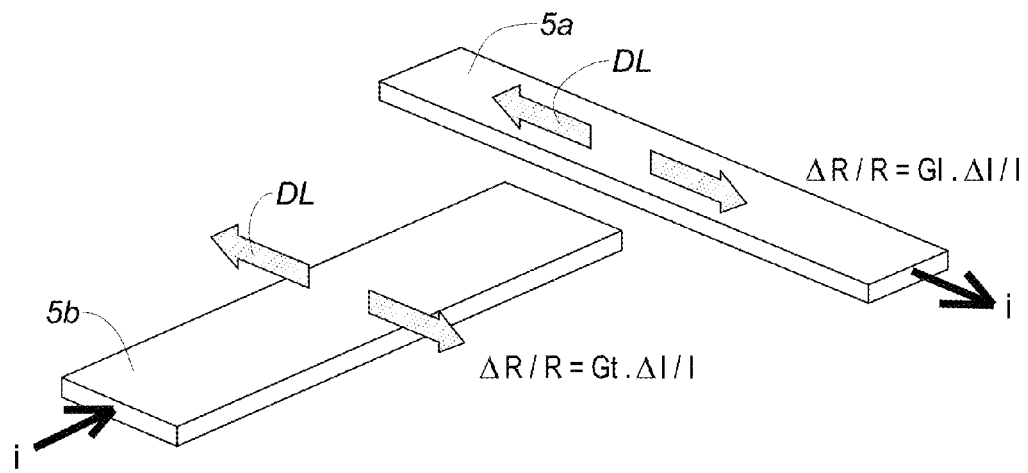
FIG. 5 illustrates the transverse and longitudinal gauge factors of the piezoresistors according to the elongation directions.
Figure 6:
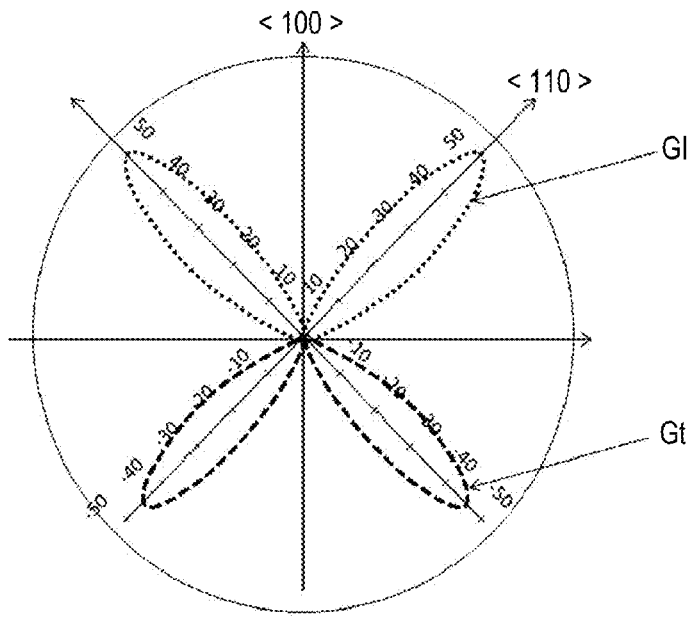
FIG. 6 represents the longitudinal and transverse gauge factors of the piezoresistors according to the crystalline plane considered.

Through this arrangement, and as shown on FIG. 6, the longitudinal and transverse gauge factors are zero in the crystalline axis <100>. This minimises the sensitivity to pressure of the resistance temperature detectors (RTD) 55a, 55b.

The pressure and temperature of the bridge response and of the detectors 55a, 55b are calibrated to compensate for the thermal effects and reach an accuracy of 0.01%, a value which is far greater than that in the current state of the art.

Figure 21:
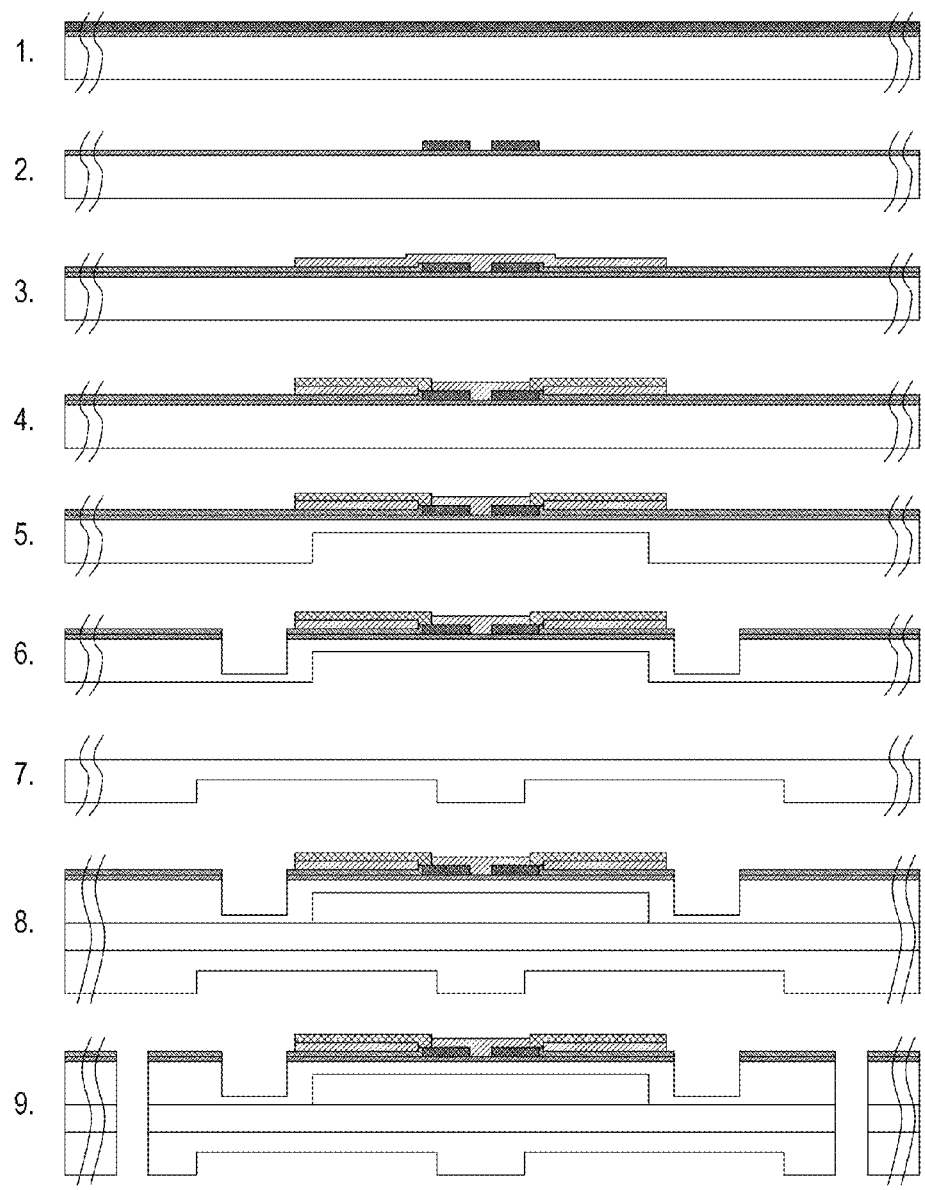
FIG. 21 illustrates the chip manufacturing process according to the examples of embodiment of the invention.

We now refer to FIG. 21, which is a diagrammatic representation of the chip manufacturing process according to the invention. This type of process includes the following steps:

Step 1: dope a Silicon On Insulator (SOI) wafer, for example with boron for doping of P type gauges, by ionic implantation;

Step 2: produce the piezoresistors and the RTDs by photolithography of the thin layer of monocrystalline silicon;

Step 3: passivate the silicon layer by thermal oxidation;

Step 4: open the contacts of the detectors, perform the deposition and photolithography of the metal to make the connections between the bridge and the electrical contacts;

Step 5: form the membrane by "DRIE" (Deep Reactive Ion Etching). The membrane thickness is controlled to obtain the required pressure range;

Step 6: form the grooves by DRIE on the front side to define the lateral compression structures;

Step 7: create the decoupling structure with central stud by DRIE micromachining of another silicon wafer;

Step 8: assemble the two wafers using a glass wafer and an electrostatic bond under vacuum. The cavities are therefore made collectively;

Step 9: test the wafer electrically, under point, and cut said wafer with a diamond saw. The chips are ready for assembly in the sensor box.

As previously explained, the Wheatstone bridge is connected directly to the data acquisition device via connection means 41 composed of conducting elements such as metal cylinders which transit via the pressure feedthrough and which connect the bridge output at the input of the differential amplifier integrated in the data processing device.

Since the operating ranges at bridge output are different from those at the input of the analogue-digital converter, the stress detection circuit output voltage must be adapted to the converter input voltage. This adaptation is traditionally carried out using a differential amplifier.

According to the invention, the stress detection circuit, comprising the Wheatstone bridge, is unbalanced, so that the bridge output voltage range for a pressure corresponding to the pressure at well bottom corresponds to a voltage close to zero.

With this arrangement, a high gain can be used on the amplifier without saturating its output, thereby using the entire range of the data acquisition device converter in the useful measurement zone.

Typically, this initial bridge offset is obtained by deliberately changing the dimensions of the longitudinal resistors with respect to the transverse resistors.

The bridge unbalance is used to adapt the bridge output range to the voltage input range of the data acquisition device for a predefined pressure range.

This adaptation optimises the performance of the data acquisition system in a pressure range around the well-bottom pressure and therefore improves the sampling accuracy of the values from the bridge around the useful measurement range.

For example, if the analogue-digital converter has an input reference of 1 volt, and if the MEMS chip has a sensitivity of 0.25 mV/bar and a bridge output voltage, for a pressure of 1000 bars, equal to 0, the offset will make it possible to apply a gain factor of 40 on the input amplifier, therefore covering with high resolution pressures from 900 bars to 1100 bars, corresponding to the reference values at well bottom, and thereby improving the sampling accuracy for this value range.

Figure 22:
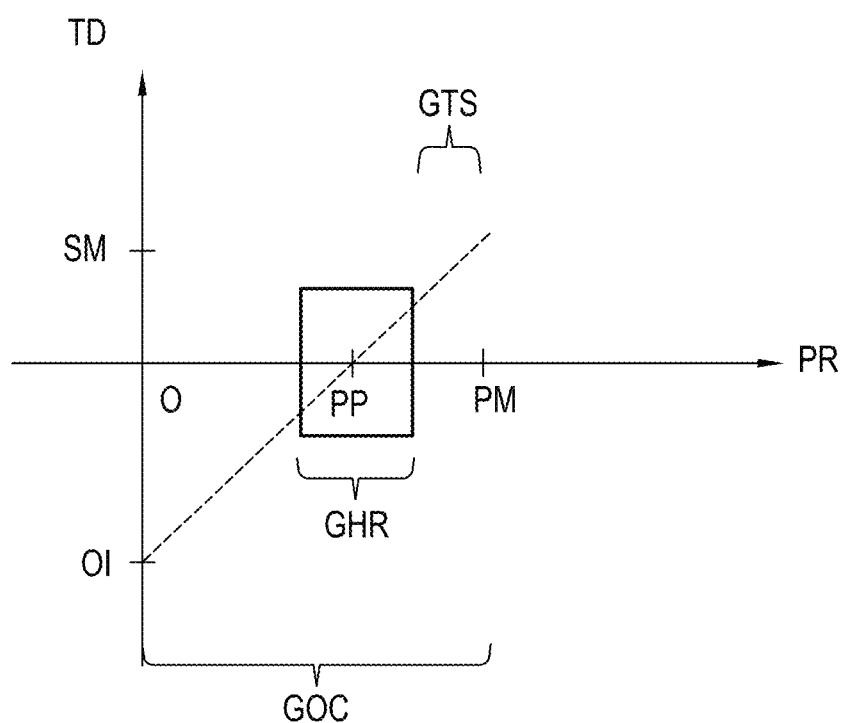
FIG. 22 provides a schematic description of the bridge unbalance voltage as a function of the pressure for the chip.

FIG. 22 provides a schematic description of the bridge unbalance voltage TD as a function of the pressure PR for the optimised MEMS chip. High gain levels can therefore be used for the interface circuit and the signal to noise ratio of the electronics can be increased. On FIG. 22, SM represents the maximum signal at break, OI is the initial offset, PM the maximum pressure, PP the pressure in the well, GOC the complete pressure measurement range, GHR the pressure measurement range at high resolution, and GTS the excess pressure resistance range.

Using this approach, a resolution of about 0.1 ppm can be reached in the range of interest, much greater than the prior art. The bridge unbalance is obtained by adjusting the geometry of the longitudinal gauges with respect to the transverse gauges.

In addition, to limit the electrical consumption of the sensor due in particular to the temperature, pressure measurements and to communication of this data, the sensor according to the invention is designed to take discontinuous measurements over limited periods of time, preferably less than one second.

According to the invention, we identify two sensor operating modes, a normal mode and a "standby" mode, to be chosen by the user.

In normal operating mode, the sensor is programmed to take temperature and pressure measurements every second.

When the user chooses a lower measurement frequency, i.e. a longer period T, the sensor is switched to "standby" mode, i.e. it will take no measurements over a period T' equal to (T−1) seconds, then take the necessary measurements during the last second of period T'.

The autonomy of the sensor located at well bottom is therefore greater, which means that the battery powering it is recharged less frequently.

In addition, to minimise the electrical consumption of the sensitive element, the piezoresistors must have a high value.

The dissipated power is expressed by the relation $P=V2/R$, which, with a voltage of 1 volt and a power consumption objective of 100 micro Watt, gives a bridge resistance of 10 kOhm. Since the targeted doping levels are relatively high for reasons explained earlier, extremely elongated resistors, typically a length to width ratio of about 100, are required. The bridge geometry must therefore be optimised so that a large number of squares can be positioned in the area of maximum stress of the membrane.

In addition, the metal connections are kept away from the stress areas of the membrane to avoid hysteresis and shift problems which could be associated with the presence of these relatively unstable materials near the sensitive elements.

The pressure sensor described in the invention can be used to record the pressure with a very high measurement resolution, in particular in the area near the well nominal pressure range.

The pressure sensor finds a particular, though non limitative application, in the domain of oil and gas exploration, production and transport. More generally, the pressure sensor can be used in harsh environment applications where the pressure may extend from a few hundred bars to more than 2000 bars.

The sensor according to the invention also includes features making it autonomous and enabling it to be operated remotely from the surface and without any human intervention, under varied operating conditions (fast and slow acquisition sequences depending on the phenomena to be observed). In addition, the sensor can communicate in real time firstly with other sensors and secondly with the surface, to adjust the operations to be carried out in the well according to the phenomena observed at the bottom.

Obviously, the invention is not limited to the types of embodiment of this pressure sensor, described above as examples, but on the contrary it encompasses all the variants.

The invention claimed is:

1. Fluid pressure measurement sensor comprising a microelectromechanical system MEMS chip, wherein:

the MEMS chip comprises two lateral walls, a sensitive membrane connected to said lateral walls and a sealed cavity;

the exterior surfaces of the lateral walls and the sensitive membrane are exposed to the fluid pressure;

the lateral walls are designed to subject the sensitive membrane to a compression stress transmitted by the opposite lateral walls where said lateral walls are connected to the sensitive membrane such that the sensitive membrane works in compression only; and the MEMS chip also comprises a stress detection circuit to measure the compression state of the sensitive membrane which is proportional to the fluid pressure.

2. Fluid pressure sensor according to claim 1, wherein the sensitive membrane has a rectangular shape comprising two long sides, and wherein the two opposite lateral walls connected to the sensitive membrane by its two long sides are designed to subject the sensitive membrane to a compression stress in a direction perpendicular to the long sides.

3. Fluid pressure sensor according to claim 1, wherein the cavity is filled with a gas whose reference pressure is less than the fluid pressure.

4. Fluid pressure sensor according to claim 2, wherein the two lateral walls are formed by grooves cut in a substrate of the MEMS chip.

5. Pressure sensor according to claim 1, wherein the sensitive membrane is connected to the MEMS chip via arches whose radius of curvature is equal to about 50 micrometers.

6. Pressure sensor according to claim 1, wherein the sensitive membrane has a rectangular shape whose length is greater than twice its width.

7. Pressure sensor according to claim 1, wherein the stress detection circuit comprises transverse and longitudinal gauges positioned in the centre of the sensitive membrane.

8. Fluid pressure sensor according to claim 1, wherein the MEMS chip comprises at least one resistance temperature detector designed to measure the effect of the temperature oriented along a crystalline axis for which the longitudinal and transverse gauge factors are zero.

9. Fluid pressure sensor according to claim 8, wherein the resistance temperature detectors take the shape of a plurality of chevrons connected together at their lateral ends.

10. Fluid pressure sensor according to claim 1, wherein the MEMS chip is attached, via a contact surface of area smaller than the MEMS chip, to a sensor body.

11. Fluid pressure sensor according to claim 10, wherein said contact surface between the MEMS chip and the sensor body comprises a central stud and a peripheral edge, the area of said contact surface between the MEMS chip and the sensor body being less than 50% of the MEMS chip area.

12. Fluid pressure sensor according to claim 1, wherein the stress detection circuit comprises a Wheatstone bridge arrangement, said circuit being unbalanced such that a voltage output range of the bridge, for a pressure corresponding to the well-bottom pressure, corresponds to a voltage close to zero.

13. Fluid pressure sensor according to claim 12, wherein a reference value of the output of the stress detection circuit corresponds to an origin of an input range of a data processing device connected to the MEMS chip.

14. Fluid pressure sensor according to claim 1, also comprising a pressure feedthrough arranged between the body housing and a support element of the MEMS chip, said pressure feedthrough comprising at least one conducting element designed to allow an electrical connection between a data processing device and the MEMS chip.

15. Fluid pressure sensor according to claim 1, wherein the sensitive membrane is subjected to the pressure of the fluid to be measured by another inert fluid separated from the first fluid by a deformable protection diaphragm.

16. Fluid pressure sensor according to claim 1, wherein the long sides of length of the sensitive membrane are separated from the outer lateral walls of the MEMS chip by a distance of between about 100 micrometers and 1 millimeter.

17. Fluid pressure sensor according to claim 1, wherein a height of the lateral walls is at least five times greater than a thickness of the sensitive membrane and a thickness of the lateral walls about three times less than said height.

18. Fluid pressure measurement probe comprising a fluid pressure sensor (11) comprising a microelectromechanical system MEMS chip, wherein:
   the MEMS chip comprises two lateral walls, a sensitive membrane connected to said lateral walls and a sealed cavity;
   the exterior surfaces of the lateral walls and the sensitive membrane are exposed to the fluid pressure;
   the lateral walls are designed to subject the sensitive membrane to a compression stress transmitted by the opposite lateral walls where said lateral walls are connected to the sensitive membrane such that the sensitive membrane works in compression only; and
   the MEMS chip also comprises a stress detection circuit to measure the compression state of the sensitive membrane which is proportional to the fluid pressure.

19. Fluid pressure measurement probe according to claim 18, wherein the sensitive membrane has a rectangular shape comprising two long sides, and wherein the two opposite lateral walls connected to the sensitive membrane by its two long sides are designed to subject the sensitive membrane to a compression stress in a direction perpendicular to the long sides.

20. Fluid pressure measurement probe according to claim 18, wherein the cavity is filled with a gas whose reference pressure is less than the fluid pressure.

21. Fluid pressure measurement probe according to claim 20, wherein the two lateral walls are formed by grooves cut in a substrate of the MEMS chip.

22. Fluid pressure measurement probe according to claim 18, wherein the sensitive membrane is connected to the MEMS chip via arches whose radius of curvature is equal to about 50 micrometers.

23. Fluid pressure measurement probe according to claim 18, wherein the sensitive membrane has a rectangular shape whose length is greater than twice its width.

24. Fluid pressure measurement probe according to claim 18, wherein the stress detection circuit comprises transverse and longitudinal gauges positioned in the centre of the sensitive membrane.

25. Fluid pressure measurement probe according to claim 18, wherein the MEMS chip comprises at least one resistance temperature detector designed to measure the effect of the temperature oriented along a crystalline axis for which the longitudinal and transverse gauge factors are zero.

26. Fluid pressure measurement probe according to claim 25, wherein the resistance temperature detectors take the shape of a plurality of chevrons connected together at their lateral ends.

27. Fluid pressure measurement probe according to claim 18, wherein the MEMS chip is attached, via a contact surface of area smaller than the MEMS chip, to a sensor body.

28. Fluid pressure measurement probe according to claim 27, wherein said contact surface between the MEMS chip and the sensor body comprises a central stud and a peripheral edge, the area of said contact surface between the MEMS chip and the sensor body being less than 50% of the MEMS chip area.

29. Fluid pressure measurement probe according to claim 18, wherein the stress detection circuit comprises a Wheatstone bridge arrangement, said circuit being unbalanced such that a voltage output range of the bridge, for a pressure corresponding to the well-bottom pressure, corresponds to a voltage close to zero.

30. Fluid pressure measurement probe according to claim 29, wherein a reference value of the output of the stress detection circuit corresponds to an origin of an input range of a data processing device connected to the MEMS chip.

31. Fluid pressure measurement probe according to claim 18, also comprising a pressure feedthrough arranged between the body housing and a support element of the MEMS chip, said pressure feedthrough comprising at least one conducting element designed to allow an electrical connection between a data processing device and the MEMS chip.

32. Fluid pressure measurement probe according to claim 18, wherein the sensitive membrane is subjected to the pressure of the fluid to be measured by another inert fluid separated from the first fluid by a deformable protection diaphragm.

33. Fluid pressure measurement probe according to claim 18, wherein the long sides of length of the sensitive membrane are separated from the outer lateral walls of the MEMS chip by a distance of between about 100 micrometers and 1 millimeter.

34. Fluid pressure measurement probe according to claim 18, wherein a height of the lateral walls is at least five times greater than a thickness of the sensitive membrane and a thickness of the lateral walls about three times less than said height.

* * * * *